United States Patent
Roeger-Goepfert et al.

(10) Patent No.: US 9,598,540 B2
(45) Date of Patent: Mar. 21, 2017

(54) COMPOSITION FOR METAL ELECTROPLATING COMPRISING LEVELING AGENT

(75) Inventors: Cornelia Roeger-Goepfert, Schwetzingen (DE); Roman Benedikt Raether, Speyer (DE); Dieter Mayer, Darmstadt (DE); Charlotte Emnet, Stuttgart (DE); Marco Arnold, Heidelberg (DE)

(73) Assignee: BASF SE, Ludwigshafen (DE)

( * ) Notice: Subject to any disclaimer, the term of this patent is extended or adjusted under 35 U.S.C. 154(b) by 460 days.

(21) Appl. No.: 13/510,328

(22) PCT Filed: Nov. 22, 2010

(86) PCT No.: PCT/EP2010/067874
§ 371 (c)(1),
(2), (4) Date: May 17, 2012

(87) PCT Pub. No.: WO2011/064154
PCT Pub. Date: Jun. 3, 2011

(65) Prior Publication Data
US 2012/0292193 A1    Nov. 22, 2012

Related U.S. Application Data

(60) Provisional application No. 61/264,705, filed on Nov. 27, 2009.

(51) Int. Cl.
*C25D 3/38*    (2006.01)
*C08G 73/02*    (2006.01)
(Continued)

(52) U.S. Cl.
CPC ............ *C08G 73/028* (2013.01); *C08L 79/02* (2013.01); *C25D 3/38* (2013.01); *H01L 21/2885* (2013.01);
(Continued)

(58) Field of Classification Search
CPC ............ C25D 3/38; C25D 3/40; H05K 3/423; C08G 73/028; C08L 79/02; H01L 21/2885; H01L 21/76877; H01L 2924/0002
(Continued)

(56) References Cited

U.S. PATENT DOCUMENTS 4,224,421 A    9/1980  Streit et al.
4,444,959 A *  4/1984  Frey et al. .................... 525/435
(Continued)

FOREIGN PATENT DOCUMENTS

DE    197 58 121    7/1999
DE    102 43 361    4/2004
(Continued)

OTHER PUBLICATIONS

U.S. Appl. No. 13/535,847, filed Jun. 28, 2012, Foeger-Goepfert, et al.
(Continued)

*Primary Examiner* — Luan Van
*Assistant Examiner* — Louis Rufo
(74) *Attorney, Agent, or Firm* — Oblon, McClelland, Maier & Neustadt, L.L.P.

(57) ABSTRACT

A composition comprising a source of metal ions and at least one additive comprising at least one polyaminoamide rep-
(Continued)

Figure 1A:
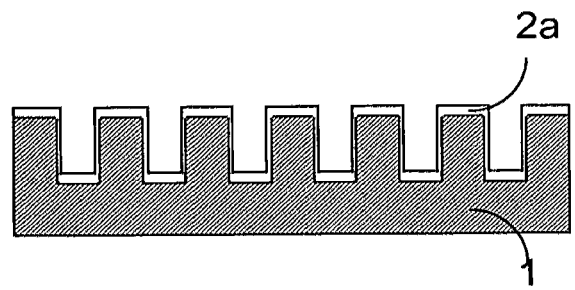

resented by formula (I) or derivatives of a polyaminoamide of formula (I) obtainable by complete or partial protonation, N-quarternisation or acylation.

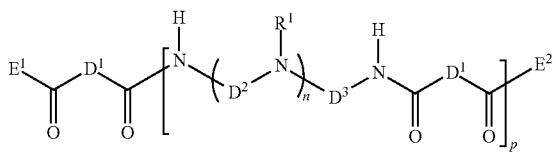

(I)

21 Claims, 6 Drawing Sheets

(51) Int. Cl.
C08L 79/02 (2006.01)
H01L 21/288 (2006.01)
H01L 21/768 (2006.01)
H05K 3/42 (2006.01)

(52) U.S. Cl.
CPC .......... *H01L 21/76877* (2013.01); *H01L 2924/0002* (2013.01); *H05K 3/423* (2013.01)

(58) Field of Classification Search
USPC ........................................ 205/295, 296, 297
See application file for complete search history.

(56) References Cited

U.S. PATENT DOCUMENTS

| | | |
|---|---|---|
| 6,024,857 A | 2/2000 | Reid |
| 6,425,996 B1* | 7/2002 | Dahms ............... C08G 73/0286 205/291 |
| 6,610,192 B1 | 8/2003 | Step et al. |
| 2003/0168343 A1 | 9/2003 | Commander et al. |
| 2004/0187731 A1 | 9/2004 | Wang et al. |
| 2005/0032667 A1 | 2/2005 | Norenberg et al. |
| 2008/0269395 A1* | 10/2008 | Reddington ............. C25D 3/38 524/440 |
| 2011/0290659 A1 | 12/2011 | Roeger-Goepfert et al. |

FOREIGN PATENT DOCUMENTS

| | | |
|---|---|---|
| DE | 196 43 091 | 11/2006 |
| EP | 1 025 839 | 8/2000 |
| EP | 1 192 941 | 4/2002 |
| EP | 1 371 757 | 12/2003 |
| EP | 1 619 274 | 1/2006 |
| EP | 1 978 134 | 10/2008 |
| GB | 1 218 394 | 1/1971 |
| GB | 1 278 896 | 6/1972 |
| JP | 2007 107074 | 4/2007 |
| WO | 03 050219 | 6/2003 |

OTHER PUBLICATIONS

U.S. Appl. No. 13/944,540, filed Jun. 14, 2013, Roeger-Goepfert, et al.
U.S. Appl. No. 13/634,140, filed Sep. 11, 2012, Roeger-Goepfert, et al.
International Search Report Issued Jun. 22, 2011 in PCT/EP10/67874 Filed Nov. 22, 2010.
U.S. Appl. No. 14/123,129, filed Nov. 19, 2013, Roeger-Goepfert, et al.
U.S. Appl. No. 14/438,688, filed Apr. 27, 2015, Kienle, et al.

* cited by examiner

COMPOSITION FOR METAL ELECTROPLATING COMPRISING LEVELING AGENT

Filling of small features, such as vias and trenches, by copper electroplating is an essential part of the semiconductor manufacture process. It is well known, that the presence of organic substances as additives in the electroplating bath can be crucial in achieving a uniform metal deposit on a substrate surface and in avoiding defects, such as voids and seams, within the copper lines.

One class of additives are the so-called levelers. Levelers are used to provide a substantially planar surface over the filled features. In literature, a variety of different leveling compounds has been described. In most cases, leveling compounds are N-containing and optionally substituted and/or quaternized polymers, such as polyethylene imine, polyglycine, poly(allylamine), polyaniline (sulfonated), polyurea, polyacrylamide, poly(melamine-co-formaldehyde) (U.S. 2004/0187731), reaction products of amines with epichlorohydrin (U.S. Pat. No. 6,610,192), reaction products of an amine, epichlorohydrin, and polyalkylene oxide (EP 1 371 757 A1), reaction products of an amine with a polyepoxide (EP 1 619 274 A2), polyvinylpyridine, polyvinylimidazole (U.S. 2003/0168343 A1), polyvinylpyrrolidone (U.S. Pat. No. 6,024,857), polyalkoxylated polyamides and polyalkanolamines (unpublished European Patent application No. 08172330.6). However, none of these documents cited discloses the use of polyaminoamide, alkoxylated polyaminoamide, functionalized polyaminoamide, or functionalized alkoxylated polyaminoamide as additives for copper electroplating baths.

U.S. Pat. No. 6,425,996 B1 discloses leveling agents comprising the reaction product of polyaminoamides and epihalohydrins, dihalohydrins and 1-halogen-2,3-propanediols, respectively.

EP 1978134 A1 discloses leveling agents comprising polyethoxylated polyamides or polyethoxylated polyaminoamides. In the examples the end groups are both polyalkoxylated with 25, 40 or 20 alkoxy repeating units.

It is an object of the present invention to provide a copper electroplating additive having good leveling properties, in particular leveling agents capable of providing a substantially planar copper layer and filling features on the nanometer and on the micrometer scale without substantially forming defects, such as but not limited to voids, with a metal electroplating bath, in particular a copper electroplating bath.

It has been found, that polyaminoamides, alkoxylated polyaminoamides, functionalized polyaminoamides, and functionalized and alkoxylated polyaminoamides can be used as additives, in particular leveling agents, in metal, particularly in copper electroplating baths showing an improved performance.

Therefore the present invention provides a composition comprising a source of metal ions and at least one additive comprising at least one polyaminoamide of formula I

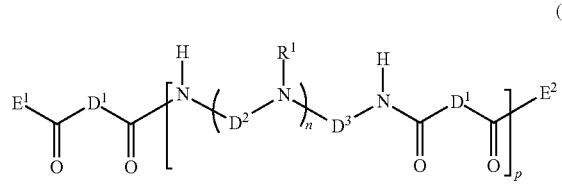

(I)

or derivatives of a polyaminoamide of formula I obtainable by complete or partial protonation or N-quarternisation, wherein $D^1$ is, for each repeating unit 1 to p independently, selected from a chemical bond or a divalent group selected from $C_1$-$C_{20}$-alkanediyl group which may optionally be interrupted (by a double bond and/or an imino group) and/or is optionally, completely or partially, a constituent of one or more saturated or unsaturated carbocyclic 5- to 8-membered rings, $D^2$, $D^3$ are independently selected from straight chain or branched C1 to C6 alkanediyl, $R^1$ is, for each repeating unit 1 to n independently, selected from $R^2$, $C_1$-$C_{20}$-alkyl and $C_1$-$C_{20}$-alkenyl, which may optionally be substituted by hydroxyl, alkoxy or alkoxycarbonyl, $R^2$ is selected from hydrogen or —$(CR^{11}R^{12}$—$CR^{13}R^{14}$—$O)_q$—H, $R^{11}$, $R^{12}$, $R^{13}$, $R^{14}$ are each independently selected from hydrogen, $C_1$-$C_{10}$-alkyl, $CH_2$—O-alkyl, $E^1$, $E^2$ are independently selected from
(a) a nucleophilically displaceable leaving group X,
(b) NH—$C_1$-$C_{20}$-alkyl or NH—$C_1$-$C_{20}$-alkenyl,
(c) H—{NH-[$D^2$-$NR^1$]$_n$-$D^3$-NH} or $R^2$—{$NR^2$-[$D^2$-$NR^1$]$_n$-$D^3$-NH},
(d) $C_1$-$C_{20}$-alkyl-CO—{NH-[$D^2$-$NR^2$]$_n$-$D^3$-NH}, and
(e) $C_1$-$C_{20}$-alkenyl-CO—{NH-[$D^2$-$NR^2$]$_n$-$D^3$-NH}, n is an integer from 1 to 250,
p is an integer from 2 to 150,
q is a number from 0.01 to 5.

It has been found that the use of compositions according to the present invention for electroplating provides deposited metal layers, particularly copper layers, having reduced overplating, particularly reduced mounding. The metal layers provided by the present invention are substantially planar, even on substrates exhibiting apertures of a very wide range of different aperture sizes (scale: below or equal 130 nanometers to 2 micrometers). Furthermore it has been found that the present invention provides metal layers substantially without the formation of added defects, such as voids, in the features.

The agents/additives according to the present invention can further advantageously be used for electroplating of copper in through silicon vias (TSV). Such vias normally have diameters of several micrometers up to 100 micrometers and large aspect ratios of at least 4, sometimes above 10.

Furthermore the agents/additives according to the present invention can advantageously be used in bonding technologies such as the manufacture of copper pillars of typically 50 to 100 micrometers height and diameter for the bumping process, in circuit board technologies like the manufacture of high-density-interconnects on printed circuit boards using microvia plating or plated-through-hole technologies, or in other packaging processes for electronic circuits.

A further significant advantage of this leveling effect is that less material has to be removed in post-deposition operations. For example, chemical mechanical polishing (CMP) is used to reveal the underlying features. The more level deposit of the invention corresponds to a reduction in the amount of metal which must be deposited, therefore resulting in less removal later by CMP. There is a reduction in the amount of scrapped metal and, more significantly, a reduction in the time required for the CMP operation. The material removal operation is also less severe which, coupled with the reduced duration, corresponds to a reduction in the tendency of the material removal operation to impart defects.

In contrast to the prior art leveling agents the leveling agents according to the present inventions are either not (poly)alkoxylated or alkoxylated or polyalkoxylated with a low average degree of alkoxylation of at least 5. A higher degree of alkoxylation leads to a much lower nitrogen content in the leveling agent. Without being bound to any theory it is believed that that a high nitrogen content in the leveling agent is responsible for a good leveling performance on substrates comprising micrometer or nanometer sized features.

Preferably the metal ions comprise copper ions.

Preferably $D^1$ is, for each repeating unit 1 to p independently, selected from a chemical bond or a $C_1$-$C_{20}$-alkanediyl group. More preferably $D^1$ is, for each repeating unit 1 to p independently, selected from a chemical bond or a linear $C_1$-$C_6$-alkanediyl group, more preferably from a linear C3-, C4-, and C5-alkanediyl, most preferably from a linear butanediyl group.

Preferably, $D^2$, $D^3$ are independently selected from straight chain or branched C1 to C6 alkanediyl, more preferably from $(CH_2)_m$, wherein m is an integer from 2 to 6, preferably 2 or 3, most preferably 2. Most preferably $D^2$, $D^3$ are independently selected from $(CH_2)_2$ or $(CH_2)_3$.

In a first preferred embodiment the polyaminoamide is unsubstituted and therefore $R^1$ is hydrogen.

In a second preferred embodiment the polyaminoamide is N-substituted and $R^1$ is, for each repeating unit 1 to n independently, selected from $C_1$-$C_{10}$-alkyl or $C_1$-$C_{10}$-alkenyl, which may optionally be substituted by hydroxyl, alkoxy or alkoxycarbonyl. More preferably $R^1$ is selected from hydrogen or C1-C3 alkyl.

In a third preferred embodiment the polyaminoamide is alkoxylated or polyalkoxylated up to an average degree of alkoxylation q of 5 and $R^1$ is, for each repeating unit 1 to n independently, selected from $-R^2$. As used herein "average degree of alkoxylation" means the number of alkoxy groups $CR^{11}R^{12}-CR^{13}R^{14}-O$ averaged over the the polymer units 1 to n, e.g. a number of 0.1 means that there is one alkoxy group per nine hydrogen atoms in the polymer.

In a fourth preferred embodiment the polyaminoamide is (poly)alkoxylated and functionalized.

Preferably q is a number from 0.1 to 5, more preferably from 0.1 to 3, more preferably from 0.1 to 2, most preferably from 0.1 to 1.

Preferably, m is 2 or 3, most preferably 2.

Preferably, n is an integer from 1 to 100, more preferably 1 to 10, more preferably 1 to 5, most preferably 1 or 2.

Preferably p is an integer from 2 to 100, more preferably from 2 to 80, most preferably from 5 to 70. p corresponds to the degree of polymerization. In average non-integer numbers are possible.

Generally, the nucleophilically displaceable leaving group X may be any functional group being nucleophilically displaceable. Preferred nucleophilically displaceable leaving group X are selected from OH, alkoxy, and halogen, most preferably from OH, $OCH_3$, $OCH_2CH_3$, and Cl.

In a preferred polyaminoamide $R^1$ is $R^2$ and $R^{11}$, $R^{12}$, and $R^{13}$ are hydrogen and $R^{14}$ is hydrogen or methyl. It is even more preferred if $R^{11}$, $R^{12}$, $R^{13}$ and $R^{14}$ are hydrogen. Furthermore, it is preferred if $R^2$ is a copolymer of at least two alkylene oxides, particularly if $R^2$ is a copolymer of ethylene oxide and propylene oxide. $R^2$ preferably may have a block, random or gradient structure or combinations thereof.

Particularly preferred polyaminoamides are those, wherein $D^1$ is selected from a chemical bond or a $C_1$-$C_{20}$-alkanediyl group, preferably a chemical bond or a linear $C_1$-$C_6$-alkanediyl group, most preferably a linear $C_4$-alkanediyl group, $D^2$, $D^3$ are selected from $(CH_2)_m$ where m is 2 or 3, preferably from $(CH_2)_2$ or $(CH_2)_3$, $R^1$ is selected from methyl or $R^2$, $R^2$ is selected from hydrogen or $-(CR^{11}_2-CR^{12}_2-O)_q-$H, preferably hydrogen, $R^{11}$, $R^{12}$, $R^{13}$ and $R^{14}$ are each independently selected from hydrogen, $C_1$-$C_3$-alkyl, $CH_2$-O-alkyl, $E^1$, $E^2$ are independently selected from OH, alkoxy, halogen, H—{NH-[$D^2$-$NR^1$]$_n$-$D^3$-NH} or $R^2$—{$NR^2$-[$D^2$-$NR^1$]$_n$-$D^3$-NH}, n is 1 or 2, p is an integer from 5 to 70.

q is a number from 0.1 to 2.

In a preferred embodiment of the present invention the at least one polyaminoamide is obtainable by reacting at least one polyalkylenepolyamine with at least one dicarboxylic acid. In particular, the at least one polyalkylenepolyamine is selected from the group of diethylenetriamine, triethylenetetramine, tetraethylenpentamine, pentaethylenehexamine, diaminopropylethylenediamine, ethylenepropylenetriamine, 3-(2-aminoethyl)aminopropylamine, dipropylenetriamine, polyethyleneimines, and mixtures thereof. In particular, the at least one dicarboxylic acid is selected from the group of oxalic acid, malonic acid, succinic acid, tartaric acid, maleic acid, itaconic acid, glutaric acid, adipic acid, suberic acid, sebacic acid, phthalic acid and terephthalic acid, iminodiacetic acid, aspartic acid, glutamic acid, and mixtures thereof.

A further embodiment of the present invention is the use of polyaminoamides as describe herein in a bath for depositing metal containing layers.

Yet another embodiment of the present invention is a process for depositing a metal layer on a substrate by contacting a plating solution as described herein with the substrate, and applying a current to the substrate to deposit a metal layer onto the substrate. The process is particularly useful for depositing metal, particularly copper layers on substrate comprising micrometer and/or submicrometer-sized features.

Due to its strong leveling performance the additives according to the present inventions are also referred to as leveling agent or leveler. Although the additive according to the present invention has strong leveling properties in electroplating of submicron-sized features, the use and performance of the additives according to the present invention is not limited to its leveling properties and may advantageously be used in other metal plating applications, e.g. for depositing through silicon vias (TSV), for other purposes.

As used herein, "feature" refers to the geometries on a substrate, such as, but not limited to, trenches and vias. "Apertures" refer to recessed features, such as vias and trenches. As used herein, the term "plating" refers to metal electroplating, unless the context clearly indicates otherwise. "Deposition" and "plating" are used interchangeably throughout this specification. The term "alkyl" means C1 to C30 alkyl and includes linear, branched and cyclic alkyl. "Substituted alkyl" means that one or more of the hydrogens on the alkyl group is replaced with another substituent group, such as, but not limited to, cyano, hydroxy, halo, (C1-C6)alkoxy, (C1-C6)alkylthio, thiol, nitro, and the like. By "substituted aryl" is meant that one or more hydrogens on the aryl ring are replaced with one or more substituent groups, such as, but not limited to, cyano, hydroxy, halo, (C1-C6)alkoxy, (C1-C6)alkyl, (C2-C6)alkenyl, (C1-C6) alkylthio, thiol, nitro, and the like. As used herein "aryl" includes carbocyclic and heterocyclic aromatic systems, such as, but not limited to, phenyl, naphthyl and the like. "Accelerator" refers to an organic additive that increases the plating rate of the electroplating bath. The terms "accelerator" and "accelerating agent" are used interchangeably throughout this specification. In literature, sometimes the accelerator component is also named "brightener" or "brightening agent". "Suppressor" refers to an organic compound that decreases the plating rate of the electroplating bath. The terms "suppressors" and "suppressing agents" are used interchangeably throughout this specification. "Leveler" refers to an organic compound that is capable of providing a substantially planar metal layer. The terms "levelers", "leveling agents" and "leveling additive" are used interchangeably throughout this specification. As used herein, "acylation" means a substitution by an acyl group, e.g. $CH_3C(O)$—. As used herein "polymer" means any compound comprising at least two monomeric units i.e. the term polymer includes dimers, trimers, etc., oligomers as well as high molecular weight polymers.

The present invention provides a plated metal layer, particularly a plated copper layer, on a substrate containing features on the nanometer and/or micrometer scale wherein the metal layer has reduced overplating and all features are substantially free of added voids, and preferably substantially free of voids. "Overplating" refers to a thicker metal deposit over dense feature areas as compared to areas free of features or at least containing relatively few features. "Dense feature areas" means an area exhibiting smaller distances between neighboring features compared to a comparative area containing apertures with a relatively large distance in between. Smaller distances means distances below 2 micrometer, and preferably below 1 micrometer, and even more preferably below 500 nm. Such difference in the plating thickness over dense feature areas as compared to the plating thickness over areas free of features or containing relatively few features is referred to as "step height" or "mounding".

Suitable substrates are any used in the manufacture of electronic devices, such as integrated circuits. Such substrates typically contain a number of features, particularly apertures, having a variety of sizes. Particularly suitable substrates are those having apertures on the nanometer and on the micrometer scale.

The present invention is achieved by combining one or more additives capable of providing a substantially planar copper layer and filling features on the nanometer and on the micrometer scale without substantially forming defects, such as but not limited to voids, with a metal electroplating bath, preferably a copper electroplating bath.

Suitable additives are polyaminoamides, alkoxylated polyaminoamides, functionalized polyaminoamides, or functionalized alkoxylated polyaminoamides or particular derivatives thereof.

Polyaminoamides are known to be polymers whose backbone chain contains both amino functionalities (NH) and amide functionalities (NH—C(O)). They are obtainable by reacting polyalkylenepolyamines with dicarboxylic acids, preferably in a molar ratio of 1:0.5 to 1:2. In general polyaminoamides are linear or branched. Linear polyaminoamides are preferred. Polyaminoamides may be polymers of the formula I as defined above.

Polyalkylenepolyamines are to be understood as meaning compounds which consist of a saturated hydrocarbon chain with terminal amino functions which is interrupted by at least one secondary amino group. Suitable polyalkylenepolyamines include but are not limited to diethylenetriamine, triethylenetetramine, tetraethylenpentamine, pentaethytenehexamine, diaminopropylethylenediamine (=N,N'-bis(3-aminopropyl)-1,2-diaminoethane)-, ethyleneproplenetriamine, 3-(2-aminoethyl)aminopropylamine, dipropylenetriamine, and polyethyleneimines with molar masses of preferably 300 to 10000, in particular from 300 to 5 000, and mixtures thereof. Preference is given to poly-C2-C3-alkyleneamines with 3 to 10 nitrogen atoms. Of these, particular preference is given to diethylenetriamine, 3-(2-aminoethyl)aminopropylamine, dipropylenetriamine, diaminopropylethylenediamine, and mixtures thereof.

Suitable dicarboxylic acids are, in particular, those with 2 to 20 carbon atoms, such as oxalic acid, malonic acid, succinic acid, tartaric acid, maleic acid, itaconic acid, glutaric acid, adipic acid, suberic acid, sebacic acid, phthalic acid and terephthalic acid, and mixtures thereof. Also suitable are dibasic amino acids, such as iminodiacetic acid, aspartic acid and glutamic acid. Preferred acids are adipic acid, glutaric acid, aspartic acid, iminodiacetic acid, and mixtures thereof.

The dicarboxylic acids can be used in the form of the free acids or as carboxylic acid derivatives, such as anhydrides, esters, amides or acid halides, in particular chlorides. Examples of such derivatives are anhydrides, such as maleic anhydride, succinic anhydride, phthalic anhydride and itaconic anhydride; adipic dichloride; esters with, preferably, C1-C2-alcohols, such as dimethyl adipate, diethyl adipate, dimethyl tartrate and dimethyl iminodiacetate; amides, such as adipic acid diamide, adipic acid monoamide and glutaric acid diamide. Preference is given to using the free carboxylic acids or the carboxylic anhydrides.

The polycondensation of the polyamine and of the dicarboxylic acid usually takes place by heating the polyamine and the dicarboxylic acid, e.g. to temperatures of from 100 to 250 degrees C., preferably 120 to 200 degrees C., and distilling off the water of reaction which forms in the condensation. If said carboxylic acid derivatives are used, the condensation can also be carried out at temperatures lower than those given. The preparation of the polyaminoamides can be carried out without the addition of a catalyst, or else with the use of an acidic or basic catalyst. Suitable acidic catalysts are, for example, acids, such as Lewis acids, e.g. sulfuric acid, p-toluenesulfonic acid, phosphorous acid, hypophosphorous acid, phosphoric acid, methanesulfonic acid, boric acid, aluminum chloride, boron trifluoride, tetraethyl orthotitanate, tin dioxide, tin butyldilaurate or mixtures thereof. Suitable basic catalysts are, for example, alkoxides, such as sodium methoxide or sodium ethoxide, alkali metal hydroxides, such as potassium hydroxide, sodium hydroxide or lithium hydroxide, alkaline earth metal oxides, such as magnesium oxide or calcium oxide, alkali metal and alkaline earth metal carbonates, such as sodium, potassium and calcium carbonate, phosphates, such as potassium phosphate and complex metal hydrides, such as sodium borohydride. Where used, the catalyst is generally used in an amount of from 0.05 to 10% by weight, preferably 0.5 to 1% by weight, based on the total amount of the starting materials.

The reaction can be carried out in a suitable solvent or preferably in the absence of a solvent. If a solvent is used, suitable examples are hydrocarbons, such as toluene or xylene, nitriles, such as acetonitrile, amides, such as N,N- dimethylformamide, N,N-dimethylacetamide, N-methylpyrrolidone, ethers, such as diethylene glycol dimethyl ether, ethylene glycol dimethyl ether, ethylene carbonate, propylene carbonate and the like. The solvent is generally distilled off during the reaction or when the reaction is complete. This distillation can optionally be carried out under a protective gas, such as nitrogen or argon.

Functionalized polyaminoamides can be synthesized from polyaminoamides in a further reaction step. An additional functionalization can serve to modify the properties of the polyaminoamides. To this end, the secondary and primary amino groups present in the polyaminoamides are converted by means of suitable agents which are capable of reaction with amino groups. This forms functionalized polyaminoamides.

The secondary and primary amino groups present in the polyaminoamide can be protonated or alkylated and/or quaternized by means of suitable protonating or alkylating agents. Examples for suitable alkylating agents are organic compounds which contain active halogen atoms, such as the aralkyl halides, the alkyl, alkenyl and alkynyl halides, and the like. Additionally, compounds such as the alkyl sulphates, alkyl sultones, epoxides, alkyl suphites, dialkyl carbonates, methyl formiate and the like may also be used. Examples of corresponding alkylating agents comprise benzyl chloride, propane sultone, dimethyl sulphate, dimethyl sulphite, dimethyl carbonate, (3-chloro-2-hydroxypropyl) trimethylammonium chloride, or the like. Preference is given to using dimethyl sulphate and/or benzyl chloride, particularly dimethylsulphate.

Furthermore, all or a part of the secondary and primary amino groups present in the polyaminoamide can be functionalized by reaction with a compound of the formula $R^{21}$—CO—X, in which $R^{21}$ has the meaning $C_1$-$C_{20}$-alkyl or $C_1$-$C_{20}$-alkenyl, where the alkyl or alkenyl groups may carry one or more substituents which are chosen from hydroxyl, alkoxy or alkoxycarbonyl. X is a nucleophilically displaceable leaving group, such as, in particular, hydroxyl, alkoxy, acyloxy or halogen, in particular chlorine. The compound of the formula $R^{21}$—CO—X is, accordingly, a carboxylic acid of the formula $R^{21}$—COOH or an ester, in particular an anhydride or a halide, in particular a chloride, thereof.

The amidation can be carried out under customary conditions without the addition of a catalyst or using an acidic or basic catalyst. Suitable catalysts are those which have been mentioned above with regard to the preparation of the parent polyaminoamides. The reaction can be carried out in a suitable solvent or preferably in the absence of a solvent. Suitable solvents and reaction conditions are those mentioned above in relation to the preparation of the parent polyaminoamides.

Instead of reacting the polyaminoamide shown above with the carboxylic acid $R^{21}$—COOH or a derivative thereof, this may alternatively be added as early as during the preparation of the polyaminoamide. Polyaminoamides with side chains of the formula $R^{21}$-carbonyl, which can be used according to the invention are, accordingly, obtainable by polycondensation of a polyamine with a dicarboxylic acid and a monocarboxylic acid of the formula $R^{21}$—COOH. The dicarboxylic acid or the monocarboxylic acid of the formula $R^{21}$—COOH can be used as they are or in the form of a derivative, such as an anhydride, ester or halide.

A further alternative involves, prior to the preparation of the polyaminoamide, amidating the polyamine partially with a monocarboxylic acid of the formula $R^{21}$—COOH or a derivative thereof, and then reacting the product with a dicarboxylic acid or a derivative thereof to give a polyaminoamide with side chains of the formula $R^{21}$-carbonyl, which can be used according to the invention.

(Poly)alkoxylated polyaminoamides containing polyether side chains, which are attached to the amino nitrogen atoms of the polymer backbone and, if present, to the amino nitrogen atoms of the end-groups of the polymer, are known e.g. from GB 1218394, EP 1025839, EP 1192941, WO03/050219 and U.S. 2005/0032667. (Poly)alkoxylated polyaminoamides are polymers wherein at least part of $R^1$ is —($CR^{11}R^{12}$—$CR^{13}R^{14}$—O)$_q$—H, with $R^{11}$, $R^{12}$, $R^{13}$, and $R^{14}$, for each repeating unit 1 to q independently, being selected from hydrogen, $C_1$-$C_{10}$-alkyl, $CH_2$—O-alkyl, such as $CH_2$—O-tert-Bu, or $CH_2$—O-aryl, such as $CH_2$—O-phenyl, and q is as defined above. $R^{11}$, $R^{12}$, and $R^{13}$ are preferably hydrogen and $R^{14}$ is preferably hydrogen or methyl.

(Poly)alkoxylated polyaminoamides can be obtained by (poly)alkoxylating polyaminoamides with $C_1$- to $C_{12}$-alkylene oxides, styrene oxide, or glycidyl ethers with the proviso that the average degree of (poly)alkoxylation is from 0.01 to 10 per secondary amino group and—where present—0.02 to 10 per primary amino group. In this reaction, alkoxylated side chains form on all or some of the amino groups of the polyaminoamides. The average value q is determined according to the molar amount of epoxide, based on the amine nitrogen atoms within the polyaminoamide which are available.

It is possible to use $C_2$- to $C_{12}$-alkylene oxides, styrene oxide, or glycidyl ethers such as glycidyl Cert-butyl ether. Examples of corresponding alkylene oxides comprise ethylene oxide and propylene oxide and also 1-butene oxide, 2,3-butene oxide, 2-methyl-1,2-propene oxide (isobutene oxide), 1-pentene oxide, 2,3-pentene oxide, 2-methyl-1,2-butene oxide, 3-methyl-1,2-butene oxide, 2,3-hexene oxide, 3,4-hexene oxide, 2-methyl-1,2-pentene oxide, 2-ethyl-1,2-butene oxide, 3-methyl-1,2-pentene oxide, decene oxide, 4-methyl-1,2-pentene oxide or styrene oxide.

Preference is given to using ethylene oxide and/or propylene oxide and/or butylene oxide. Higher alkylene oxides are generally used, at most, in small amounts for fine adjustment of the properties. In general, the amount of ethylene oxide and/or propylene oxide and/ or butylene oxide is at least 80% by weight, preferably 95% by weight and more preferably 95% by weight based on the sum of all alkylene oxides used. Generally, the average degree of alkoxylation is from about 0.01 to about 5, preferably from about 0.1 to about 5, more preferably from about 0.1 to about 3, most preferably from about 0.1 to about 2 and, for example, 0.1 to 1 oxyalkylene units per secondary amino group. The average degree of alkoxylation per terminal primary amino group is from about 0.02 to about 10, preferably from about 0.2 to about 10, more preferably from about 0.2 to about 6, most preferably from about 0.2 to about 4 and, for example, 0.2 to 2 oxyalkylene units.

When two or more different alkylene oxides are used, the polyoxyalkylene groups formed may be random copolymers, gradient copolymers, block copolymers or alternating copolymers.

The synthesis of alkylene oxide units is known to those skilled in the art. Comprehensive details are given, for example, in "Polyoxyalkylenes" in Ullmann's Encyclopedia of Industrial Chemistry, $6^{th}$ Edition, Electronic Release.

When q is from about 0.01 to about 1 preference is given to undertaking the alkoxylation in the presence of water being used as a catalyst. For q greater 1 preference is given to undertaking the alkoxylation in the presence of a customary basic catalyst, for example alkali metal hydroxides, preferably potassium hydroxide, or alkali metal alkoxides, for example, sodium methoxide or potassium tert-butylate. In addition, it is also possible to use double metal cyanide catalysts (DMC catalysts). Suitable DMC catalysts are disclosed, for example, in DE 102 43 361 A1, especially paragraphs [0029] to [0041] and the literature cited therein. The alkoxylation can be undertaken, in a manner known in principle, in a pressure reactor at from 40 to 250 degree C., preferably from 80 to 200 degree C. and more preferably from 100 to 150 degree C. For the correct metered addition of the alkylene oxides, it is advisable, before the alkoxylation, to determine the number (secondary) amine groups of the polyaminoamide.

The (poly)alkoxylated polyaminoamides can optionally be functionalized in a further reaction step. An additional functionalization can serve to modify the properties of the alkoxylated polyaminoamides. To this end, the hydroxyl groups and/or amino groups present in the alkoxylated polyaminoamides are converted by means of suitable agents which are capable of reaction with hydroxyl groups and/or amino groups. This forms functionalized alkoxylated polyaminoamides.

For example, the amino groups present in the alkoxylated polyaminoamide can be protonated or functionalized by means of suitable alkylating agents.

Examples for suitable alkylating agents are organic compounds which contain active halogen atoms, such as the aralkyl halides, the alkyl, alkenyl and alkynyl halides, and the like. Additionally, compounds such as the alkyl sulfates, alkyl sultones, epoxides, alkyl suphites, dialkyl carbonates, methyl formiate and the like may also be used. Examples of corresponding alkylating agents comprise benzyl chloride, propane sultone, dimethyl sulphate, dimethyl sulphite, dimethyl carbonate, (3-chloro-2-hydroxypropyl)trimethylammonium chloride, or the like. Preference is given to using dimethyl sulphate and/or benzyl chloride.

The terminal hydroxyl groups of the alkoxylated polyaminoamide can be reacted with suitable reagents for derivatization, which forms groups of the general formula—(alkoxy)$_q$-Y where X is any desired group. The type of functionalization depends on the desired end use. According to the functionalizing agent, the chain end can be hydrophobized or more strongly hydrophilized.

The terminal hydroxyl groups can be esterified, for example, with sulfuric acid or derivatives thereof, so as to form products with terminal sulfate groups. Analogously, products having terminal phosphorus groups can be obtained with phosphoric acid, phosphorous acid, polyphosphoric acid, POCl$_3$ or P$_4$O$_{10}$.

In addition, the terminal OH groups may also be etherified, so as to form ether-terminated polyalkoxy groups of the general formula—(alkoxy)$_n$-O—R$^7$, where R$^7$ is an alkyl, alkenyl, alkynyl, alkaryl, or aryl group.

It will be appreciated by those skilled in the art that more than one leveling agent may be used. When two or more leveling agents are used, at least one of the leveling agents is a polyaminoamide or a derivative thereof as described herein. It is preferred to use only one polyaminoamide leveling agent in the plating composition.

Suitable additional leveling agents include, but are not limited to, one or more of polyalkanolamine and derivatives thereof, polyethylene imine and derivatives thereof, quaternized polyethylene imine, polyglycine, poly(allylamine), polyaniline, polyurea, polyacrylamide, poly(melamine-co-formaldehyde), reaction products of amines with epichlorohydrin, reaction products of an amine, epichlorohydrin, and polyalkylene oxide, reaction products of an amine with a polyepoxide, polyvinylpyridine, polyvinylimidazole, polyvinylpyrrolidone, or copolymers thereof, nigrosines, pentamethyl-para-rosaniline hydrohalide, hexamethyl-pararosaniline hydrohalide, or compounds containing a functional group of the formula N—R—S, where R is a substituted alkyl, unsubstituted alkyl, substituted aryl or unsubstituted aryl. Typically, the alkyl groups are (C1-C6)alkyl and preferably (C1-C4)alkyl. In general, the aryl groups include (C6-C20)aryl, preferably (C6-C10)aryl. Such aryl groups may further include heteroatoms, such as sulfur, nitrogen and oxygen. It is preferred that the aryl group is phenyl or napthyl. The compounds containing a functional group of the formula N—R—S are generally known, are generally commercially available and may be used without further purification. Further leveling agents are Triethanol condensates as described in In such compounds containing the N—R—S functional group, the sulfur ("S") and/or the nitrogen ("N") may be attached to such compounds with single or double bonds. When the sulfur is attached to such compounds with a single bond, the sulfur will have another substituent group, such as but not limited to hydrogen, (C1-C12)alkyl, (C2-C12)alkenyl, (C6-C20)aryl, (C1-C12)alkylthio, (C2-C12)alkenylthio, (C6-C20)arylthio and the like. Likewise, the nitrogen will have one or more substituent groups, such as but not limited to hydrogen, (C1-C12)alkyl, (C2-C12)alkenyl, (C7-C10)aryl, and the like. The N—R—S functional group may be acyclic or cyclic. Compounds containing cyclic N—R—S functional groups include those having either the nitrogen or the sulfur or both the nitrogen and the sulfur within the ring system.

In general, the total amount of leveling agents in the electroplating bath is from 0.5 ppm to 10000 ppm based on the total weight of the plating bath. The leveling agents according to the present invention are typically used in a total amount of from about 0.1 ppm to about 1000 ppm based on the total weight of the plating bath and more typically from 1 to 100 ppm, although greater or lesser amounts may be used.

The electroplating baths according to the present invention may include one or more optional additives. Such optional additives include, but are not limited to, accelerators, suppressors, surfactants and the like. Such suppressors and accelerators are generally known in the art. It will be clear to one skilled in the art which suppressors and/or accelerators to use and in what amounts.

A large variety of additives may typically be used in the bath to provide desired surface finishes for the Cu plated metal. Usually more than one additive is used with each additive forming a desired function. Advantageously, the electroplating baths may contain one or more of accelerators, suppressors, sources of halide ions, grain refiners and mixtures thereof. Most preferably the electroplating bath contains both, an accelerator and a suppressor in addition to the leveling agent according to the present invention. Other additives may also be suitably used in the present electroplating baths.

Any accelerators may be advantageously used in the present invention. Accelerators useful in the present invention include, but are not limited to, compounds comprising one or more sulphur atom and a sulfonic/phosphonic acid or their salts.

The generally preferred accelerators have the general structure $M^4O_3X^4—R^{41}—(S)_a—R^{42}$, with:

$M^4$ is a hydrogen or an alkali metal (preferably Na or K)

$X^4$ is P or S a=1 to 6

$R^{41}$ is selected from C1-C8 alkyl group or heteroalkyl group, an aryl group or a heteroaromatic group. Heteroalkyl groups will have one or more heteroatom (N, S, O) and 1-12 carbons. Carbocyclic aryl groups are typical aryl groups, such as phenyl, naphtyl. Heteroaromatic groups are also suitable aryl groups and contain one or more N,O or S atom and 1-3 separate or fused rings.

$R^{42}$ is selected from H or (—S—$R^{41'}XO_3M$), with $R^{41''}$ being identical or different from $R^{41}$.

More specifically, useful accelerators include those of the following formulae:

$X^4O_3S$—$R^{41}$—SH
$X^4O_3S$—$R^{41}$—S—S—$R^{41'}$—$SO_3X^4$
$X^4O_3S$—Ar—S—S—Ar—$SO_3X^4$ with $R^{41}$ as defined above and Ar is Aryl.

Particularly prefered accelerating agents are:
SPS: bis-(3-sulfopropyl)-disulfide disodium salt
MPS: 3-mercapto-1-propansulfonic acid, sodium salt Other examples of accelerators, used alone or in mixture, include, but are not limited to: MES (2-Mercaptoethanesulfonic acid, sodium salt); DPS (N,N-dimethyldithiocarbamic acid (3-sulfopropylester), sodium salt); UPS (3-[(amino-iminomethyl)-thio]-1-propylsulfonic acid); ZPS (3-(2-benzthiazolylthio)-1-propanesulfonic acid, sodium salt); 3-mercapto-propylsulfonicacid-(3-sulfopropyl)ester; methyl-(ω-sulphopropyl)-disulfide, disodium salt; methyl-(ω-sulphopropyl)-trisulfide, disodium salt.

Such accelerators are typically used in an amount of about 0.1 ppm to about 3000 ppm, based on the total weight of the plating bath. Particularly suitable amounts of accelerator useful in the present invention are 1 to 500 ppm, and more particularly 2 to 100 ppm.

Any suppressor may be advantageously used in the present invention. Suppressors useful in the present invention include, but are not limited to, polymeric materials, particularly those having heteroatom substitution, and more particularly oxygen substitution. It is preferred that the suppressor is a polyalkyleneoxide. Suitable suppressors include polyethylene glycol copolymers, particularly polyethylene glycol polypropylene glycol copolymers. The arrangement of ethylene oxide and propylene oxide of suitable suppressors may be block, gradient, or random. The polyalkylene glycol may comprise further alkylene oxide building blocks such as butylene oxide. Preferably, the average molecular weight of suitable suppressors exceeds about 2000 g/mol. The starting molecules of suitable polyalkylene glycol may be alkyl alcohols such as methanol, ethanol, propanol, n-butanol and the like, aryl alcohols such as phenols and bisphenols, alkaryl alcohols such as benzyl alcohol, polyol starters such as glycol, glycerin, trimethylol propane, pentaerythritol, sorbitol, carbohydrates such as saccharose, and the like, amines and oligoamines such as alkyl amines, aryl amines such as aniline, triethanol amine, ethylene diamine, and the like, amides, lactams, heterocyclic amines such as imidazol and carboxylic acids. Optionally, polyalkylene glycol suppressors may be functionalized by ionic groups such as sulfate, sulfonate, ammonium, and the like.

Particularly useful suppressing agents in combination with the levelers according to the present inventions are:

(a) Suppressing agents obtainable by reacting an amine compound comprising at least three active amino functional groups with a mixture of ethylene oxide and at least one compound selected from C3 and C4 alkylene oxides as described in European Patent Application No. 9157540.7.

Preferably the amine compound is selected from diethylene triamine, 3-(2-aminoethyl)aminopropylamine, 3,3'-iminodi(propylamine), N,N-bis(3-aminopropyl)methylamine, bis(3-dimethylaminopropyl)amine, triethylenetetraamine and N,N'-bis(3-aminopropyl)ethylenediamine.

(b) Suppressing agents obtainable by reacting an amine compound comprising active amino functional groups with a mixture of ethylene oxide and at least one compound selected from C3 and C4 alkylene oxides, said suppressing agent having a molecular weight $M_w$ of 6000 g/mol or more, forming an ethylene C3 and/or C4 alkylene random copolymer as described in European Patent Application No. 09157542.3.

(c) Suppressing agent obtainable by reacting an amine compound comprising at least three active amino functional groups with ethylene oxide and at least one compound selected from C3 and C4 alkylene oxides from a mixture or in sequence, said suppressing agent having a molecular weight $M_w$ of 6000 g/mol or more as described in European Patent Application No. 09157543.1.

Preferably the amine compound is selected from ethylene diamine, 1,3-diaminopropane, 1,4-diaminobutane, 1,5-diaminopentane, 1,6-diaminohexane, neopentanediamine, isophoronediamine, 4,9-dioxadecane-1,12-diamine, 4,7,10-trioxatridecane-1,13-diamine, triethylene glycol diamine, diethylene triamine, (3-(2-aminoethyl)aminopropylamine, 3,3'-iminodi(propylamine), N,N-bis(3-aminopropyl)methylamine, bis(3-dimethylaminopropyl)amine, triethylenetetraamine and N,N'-bis(3-aminopropyl)ethylenediamine.

(d) Suppressing agent selected from compounds of formula S1

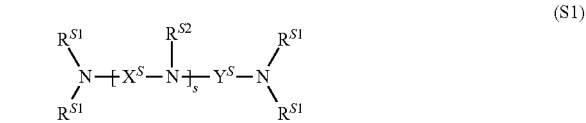

(S1)

wherein the $R^{S1}$ radicals are each independently selected from a copolymer of ethylene oxide and at least one further C3 to C4 alkylene oxide, said copolymer being a random copolymer, the $R^{S2}$ radicals are each independently selected from $R^{S1}$ or alkyl, $X^S$ and $Y^S$ are spacer groups independently, and $X^S$ for each repeating unit independently, selected from C2 to C6 alkylene and $Z^S$—(O—$Z^S$)$_t$ wherein the $Z^S$ radicals are each independently selected from C2 to C6 alkylene, s is an integer equal to or greater than 0, and t is an integer equal to or greater than 1, as described in European Patent Application No. 09005106.1.

Preferably spacer groups $X^S$ and $Y^S$ are independently, and $X^S$ for each repeating unit independently, selected from C2 to C4 alkylene. Most preferably $X^S$ and $Y^S$ are independently, and $X^S$ for each repeating unit independently, selected from ethylene (—$C_2H_4$—) or propylene (—$C_3H_6$—).

Preferably $Z^S$ is selected from C2 to C4 alkylene, most preferably from ethylene or propylene.

Preferably s is an integer from 1 to 10, more preferably from 1 to 5, most preferably from 1 to 3. Preferably t is an integer from 1 to 10, more preferably from 1 to 5, most preferably from 1 to 3.

In another preferred embodiment the C3 to C4 alkylene oxide is selected from propylene oxide (PO). In this case EO/PO copolymer side chains are generated starting from the active amino functional groups The content of ethylene oxide in the copolymer of ethylene oxide and the further C3 to C4 alkylene oxide can generally be from about 5% by weight to about 95% by weight, preferably from about 30% by weight to about 70% by weight, particularly preferably between about 35% by weight to about 65% by weight.

The compounds of formula (S1) are prepared by reacting an amine compound with one ore more alkylene oxides. Preferably the amine compound is selected from ethylene diamine, 1,3-diaminopropane, 1,4-diaminobutane, 1,5-diaminopentane, 1,6-diaminohexane, neopentanediamine, isophoronediamine, 4,9-dioxadecane-1,12-diamine, 4,7,10-trioxatridecane-1,13-diamine, triethylene glycol diamine, diethylene triamine, (3-(2-aminoethyl)amino)propylamine, 3,3'-iminodi(propylamine), N,N-bis(3-aminopropyl)methylamine, bis(3-dimethylaminopropyl)amine, triethylenetetraamine and N,N'-bis(3-aminopropyl)ethylenediamine.

The molecular weight $M_w$ of the suppressing agent of formula S1 may be between about 500 g/mol to about 30000 g/mol. Preferably the molecular weight $M_w$ should be about 6000 g/mol or more, preferably from about 6000 g/mol to about 20000 g/mol, more preferably from about 7000 g/mol to about 19000 g/mol, and most preferably from about 9000 g/mol to about 18000 g/mol. Preferred total amounts of alkylene oxide units in the suppressing agent may be from about 120 to about 360, preferably from about 140 to about 340, most preferably from about 180 to about 300.

Typical total amounts of alkylene oxide units in the suppressing agent may be about 110 ethylene oxide units (EO) and 10 propylene oxide units (PO), about 100 EO and 20 PO, about 90 EO and 30 PO, about 80 EO and 40 PO, about 70 EO and 50 PO, about 60 EO and 60 PO, about 50 EO and 70 PO, about 40 EO and 80 PO, about 30 EO and 90 PO, about 100 EO and 10 butylene oxide (BuO) units, about 90 EO and 20 BO, about 80 EO and 30 BO, about 70 EO and 40 BO, about 60 EO and 50 BO or about 40 EO and 60 BO to about 330 EO and 30 PO units, about 300 EO and 60 PO, about 270 EO and 90 PO, about 240 EO and 120 PO, about 210 EO and 150 PO, about 180 EO and 180 PO, about 150 EO and 210 PO, about 120 EO and 240 PO, about 90 EO and 270 PO, about 300 EO and 30 butylene oxide (BuO) units, about 270 EO and 60 BO, about 240 EO and 90 BO, about 210 EO and 120 BO, about 180 EO and 150 BO, or about 120 EO and 180 BO.

(e) Suppressing agent obtainable by reacting a polyhydric alcohol condensate compound derived from at least one polyalcohol of formula (S2) $X^S(OH)_u$ by condensation with at least one alkylene oxide to form a polyhydric alcohol condensate comprising polyoxyalkylene side chains, wherein u is an integer from 3 to 6 and $X^S$ is an u-valent linear or branched aliphatic or cycloaliphatic radical having from 3 to 10 carbon atoms, which may be substituted or unsubstituted, as described in U.S. Provisional Application No. 61/229803.

Preferred polyalcohol condensates are selected from compounds of formulae

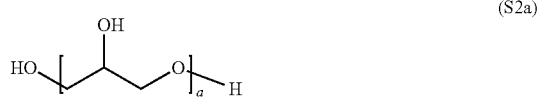

(S2a)

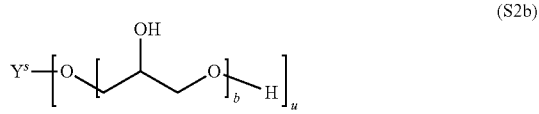

(S2b)

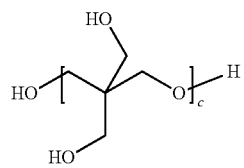

(S2c)

wherein $Y^S$ is an u-valent linear or branched aliphatic or cycloaliphatic radical having from 1 to 10 carbon atoms, which may be substituted or unsubstituted, a is an integer from 2 to 50, b may be the same or different for each polymer arm u and is an integer from 1 to 30, c is an integer from 2 to 3, and n is an integer from 1 to 6. Most preferred Polyalcohols are glycerol condensates and/or pentaerythritol condensates.

(f) Suppressing agent obtainable by reacting a polyhydric alcohol comprising at least 5 hydroxyl functional groups with at least one alkylene oxide to form a polyhydric alcohol comprising polyoxyalkylene side chains as described in U.S. Provisional Application No. 61/229809. Preferred polyalcohols are linear or cyclic monosaccharide alcohols represented by formula (S3a) or (S3b)

$$HOCH_2—(CHOH)_v—CH_2OH \quad (S3a)$$

$$(CHOH)_w \quad (S3b)$$

wherein v is an integer from 3 to 8 and w is an integer form 5 to 10. Most preferred monosaccharide alcohols are sorbitol, mannitol, xylitol, ribitol and inositol. Further preferred polyalcohols are monosaccharides of formula (S4a) or (S4b)

$$CHO—(CHOH)_x—CH_2OH \quad (S4a)$$

$$CH_2OH—(CHOH)_y—CO—(CHOH)_z—CH_2OH \quad (S4b)$$

wherein x is an integer of 4 to 5, and y, z are integers and y+z is 3 or 4. Most preferred monosaccharide alcohols are selected from the aldoses allose, altrose, galactose, glucose, gulose, idose, mannose, talose, glucoheptose, mannoheptose or the ketoses fructose, psicose, sorbose, tagatose, mannoheptulose, sedoheptulose, taloheptulose, alloheptulose.

These are particularly effective, strong suppressing agents that cope with the seed overhang issue and provide substantially defect free trench filling despite a non-conformal copper seed.

When suppressors are used, they are typically present in an amount in the range of from about 1 to about 10,000 ppm based on the weight of the bath, and preferably from about 5 to about 10,000 ppm.

The metal ion source may be any compound capable of releasing metal ions to be deposited in the electroplating bath in sufficient amount, i.e is at least partially soluble in the electroplating bath. It is preferred that the metal ion source is soluble in the plating bath. Suitable metal ion sources are metal salts and include, but are not limited to, metal sulfates, metal halides, metal acetates, metal nitrates, metal fluoroborates, metal alkylsulfonates, metal arylsulfonates, metal sulfamates, metal gluconates and the like. It is preferred that the metal is copper. It is further preferred that the source of metal ions is copper sulfate, copper chloride, copper acetate, copper citrate, copper nitrate, copper fluoroborate, copper methane sulfonate, copper phenyl sulfonate and copper p-toluene sulfonate. Copper sulfate pentahydrate and copper methane sulfonate are particularly preferred. Such metal salts are generally commercially available and may be used without further purification.

Besides metal electroplating the compositions may be used in electroless deposition of metal containing layers. The compositions may particularly used in the deposition of barrier layers containing Ni, Co, Mo, W and/or Re. In this case, besides metal ions, further elements of groups III and V, particularly B and P may be present in the composition for electroless deposition and thus co-deposited with the metals.

The metal ion source may be used in the present invention in any amount that provides sufficient metal ions for electroplating on a substrate. Suitable metal ion metal sources include, but are not limited to, tin salts, copper salts, and the like. When the metal is copper, the copper salt is typically present in an amount in the range of from about 1 to about 300 g/l of plating solution. It will be appreciated mixtures of metal salts may be electroplated according to the present invention. Thus, alloys, such as copper-tin having up to about 2 percent by weight tin, may be advantageously plated according to the present invention. The amounts of each of the metal salts in such mixtures depend upon the particular alloy to be plated and is well known to those skilled in the art.

In general, besides the metal ion source and at least one of the leveling agents (S2) to (S4), further referred to as polyalkanolamines, the present metal electroplating compositions preferably include electrolyte, i. e. acidic or alkaline electrolyte, one or more sources of metal ions, optionally halide ions, and optionally other additives like accelerators and/or suppressors. Such baths are typically aqueous. The water may be present in a wide range of amounts. Any type of water may be used, such as distilled, deionized or tap.

The electroplating baths of the present invention may be prepared by combining the components in any order. It is preferred that the inorganic components such as metal salts, water, electrolyte and optional halide ion source, are first added to the bath vessel followed by the organic components such as leveling agents, accelerators, suppressors, surfactants and the like.

Typically, the plating baths of the present invention may be used at any temperature from 10 to 65 degrees C. or higher. It is preferred that the temperature of the plating baths is from 10 to 35 degrees C. and more preferably from 15 degrees to 30 degrees C.

Suitable electrolytes include such as, but not limited to, sulfuric acid, acetic acid, fluoroboric acid, alkylsulfonic acids such as methanesulfonic acid, ethanesulfonic acid, propanesulfonic acid and trifluoromethane sulfonic acid, arylsulfonic acids such as phenyl sulfonic acid and toluenesulfonic acid, sulfamic acid, hydrochloric acid, phosphoric acid, tetraalkylammonium hydroxide, preferably tetramethylammonium hydroxide, sodium hydroxide, potassium hydroxide and the like. Acids are typically present in an amount in the range of from about 1 to about 300 g/L, alkaline electrolytes are typically present in an amount of about 0.1 to about 20 g/L or to yield a pH of 8 to 13 respectively, and more typically, to yield a pH of 9 to 12.

Such electrolytes may optionally contain a source of halide ions, such as chloride ions as in copper chloride or hydrochloric acid. A wide range of halide ion concentrations may be used in the present invention such as from about 0 to about 500 ppm. Typically, the halide ion concentration is in the range of from about 10 to about 100 ppm based on the plating bath. It is preferred that the electrolyte is sulfuric acid or methanesulfonic acid, and preferably a mixture of sulfuric acid or methanesulfonic acid and a source of chloride ions. The acids and sources of halide ions useful in the present invention are generally commercially available and may be used without further purification.

The general process of copper electrodeposition on semiconductor integrated circuit substrates is described with respect to FIGS. 1 and 2 without restricting the invention thereto.

Figure 1B:
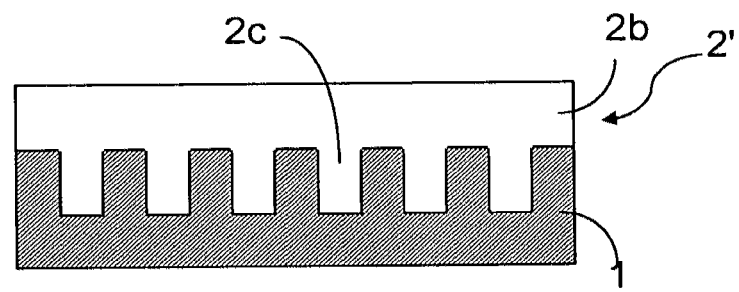
Figure 1C:
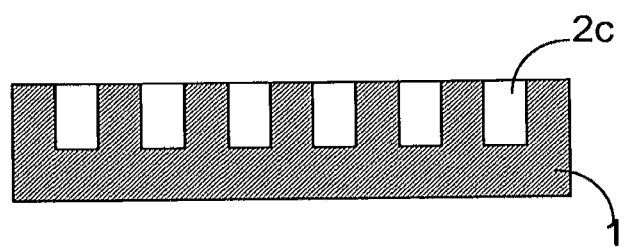

FIG. 1a shows a dielectric substrate 1 seeded with a copper layer 2a. With reference to FIG. 1b a copper layer 2' is deposited onto the dielectric substrate 1 by electrodeposition. The trenches 2c of the substrate 1 are filled and an overplating of copper 2b, also referred to as "overburden", is generated on top of the whole structured substrate. During the process, after optional annealing, the overburden of copper 2b is removed by chemical mechanical planarization (CMP), as depicted in FIG. 1c.

Figure 2A:
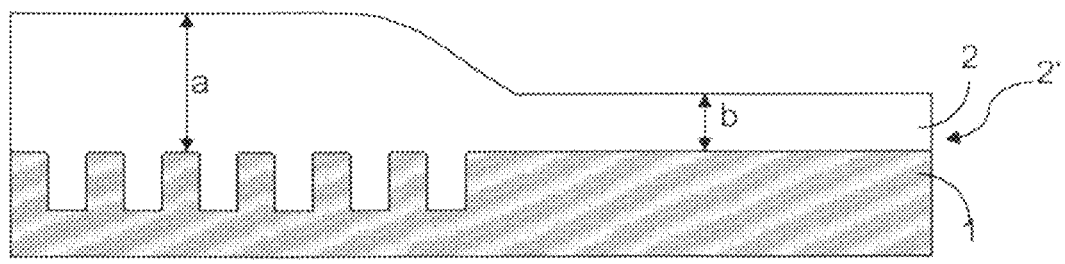
Figure 2B:
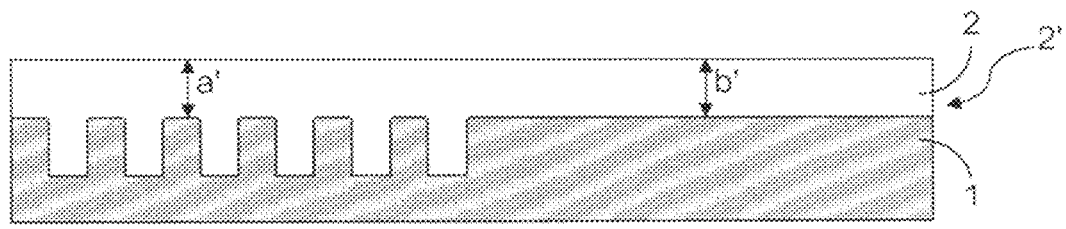

The effect of a leveling agent is generally described with respect to FIGS. 2a and 2b. Without a leveling agent the deposition leads to a high ratio a/b much greater then 1, the so called mounding. In contrast, the aim is to reduce the ratio a/b to a value, which is as close as possible to 1.

A particular advantage of the present invention is that overplating, particularly mounding, is reduced or substantially eliminated. Such reduced overplating means less time and effort is spent in removing metal, such as copper, during subsequent chemical-mechanical planarization (CMP) processes, particularly in semiconductor manufacture. A further advantage of the present invention is that a wide range of aperture sizes may be filled within a single substrate resulting in a substantially even surface having a ratio a/b of 1.5 or less, preferably 1.2 or less, most preferably 1.1 or less. Thus, the present invention is particularly suitable to evenly filling apertures in a substrate having a variety of aperture sizes, such as from 0.01 micrometer to 100 micrometer or even larger.

A further significant advantage of this leveling effect is that less material has to be removed in post-deposition operations. For example, chemical mechanical planarization (CMP) is used to reveal the underlying features. The more level deposit of the invention corresponds to a reduction in the amount of metal which must be deposited, therefore resulting in less removal later by CMP. There is a reduction in the amount of scrapped metal and, more significantly, a reduction in the time required for the CMP operation. The material removal operation is also less severe which, coupled with the reduced duration, corresponds to a reduction in the tendency of the material removal operation to impart defects.

Metal, particularly copper, is deposited in apertures according to the present invention without substantially forming voids within the metal deposit. By the term "without substantially forming voids", it is meant that 95% of the plated apertures are void-free. It is preferred that the plated apertures are void-free.

Typically, substrates are electroplated by contacting the substrate with the plating baths of the present invention. The substrate typically functions as the cathode. The plating bath contains an anode, which may be soluble or insoluble. Optionally, cathode and anode may be separated by a membrane. Potential is typically applied to the cathode. Sufficient current density is applied and plating performed for a period of time sufficient to deposit a metal layer, such as a copper layer, having a desired thickness on the substrate. Suitable current densities, include, but are not limited to, the range of 1 to 250 mA/cm$^2$. Typically, the current density is in the range of 1 to 60 mA/cm$^2$ when used to deposit copper in the manufacture of integrated circuits. The specific current density depends upon the substrate to be plated, the leveling agent selected and the like. Such current density choice is within the abilities of those skilled in the art. The applied current may be a direct current (DC), a pulse current (PC), a pulse reverse current (PRC) or other suitable current.

In general, when the present invention is used to deposit metal on a substrate such as a wafer used in the manufacture of an integrated circuit, the plating baths are agitated during use. Any suitable agitation method may be used with the present invention and such methods are well-known in the art. Suitable agitation methods include, but are not limited to, inert gas or air sparging, work piece agitation, impingement and the like. Such methods are known to those skilled in the art. When the present invention is used to plate an integrated circuit substrate, such as a wafer, the wafer may be rotated such as from 1 to 150 RPM and the plating solution contacts the rotating wafer, such as by pumping or spraying. In the alternative, the wafer need not be rotated where the flow of the plating bath is sufficient to provide the desired metal deposit.

Metal, particularly copper, is deposited in apertures according to the present invention without substantially forming voids within the metal deposit. By the term "without substantially forming voids", it is meant that 95% of the plated apertures are void-free. It is preferred that the plated apertures are void-free.

While the process of the present invention has been generally described with reference to semiconductor manufacture, it will be appreciated that the present invention may be useful in any electrolytic process where an essentially level or planar copper deposit having high reflectivity is desired, and where reduced overplating and metal filled small features that are substantially free of voids are desired. Such processes include printed wiring board manufacture. For example, the present plating baths may be useful for the plating of vias, pads or traces on a printed wiring board, as well as for bump plating on wafers. Other suitable processes include packaging and interconnect manufacture. Accordingly, suitable substrates include lead frames, interconnects, printed wiring boards, and the like.

Plating equipment for plating semiconductor substrates are well known. Plating equipment comprises an electroplating tank which holds Cu electrolyte and which is made of a suitable material such as plastic or other material inert to the electrolytic plating solution. The tank may be cylindrical, especially for wafer plating. A cathode is horizontally disposed at the upper part of tank and may be any type substrate such as a silicon wafer having openings such as trenches and vias. The wafer substrate is typically coated with a seed layer of Cu or other metal to initiate plating thereon. A Cu seed layer may be applied by chemical vapor deposition (CVD), physical vapor deposition (PVD), or the like. An anode is also preferably circular for wafer plating and is horizontally disposed at the lower part of tank forming a space between the anode and cathode. The anode is typically a soluble anode.

These bath additives are useful in combination with membrane technology being developed by various tool manufacturers. In this system, the anode may be isolated from the organic bath additives by a membrane. The purpose of the separation of the anode and the organic bath additives is to minimize the oxidation of the organic bath additives.

The cathode substrate and anode are electrically connected by wiring and, respectively, to a rectifier (power supply). The cathode substrate for direct or pulse current has a net negative charge so that Cu ions in the solution are reduced at the cathode substrate forming plated Cu metal on the cathode surface. An oxidation reaction takes place at the anode. The cathode and anode may be horizontally or vertically disposed in the tank.

The present invention is useful for depositing a metal layer, particularly a copper layer, on a variety of substrates, particularly those having variously sized apertures. For example, the present invention is particularly suitable for depositing copper on integrated circuit substrates, such as semiconductor devices, with small diameter vias, trenches or other apertures. In one embodiment, semiconductor devices are plated according to the present invention. Such semiconductor devices include, but are not limited to, wafers used in the manufacture of integrated circuits.

While the process of the present invention has been generally described with reference to semiconductor manufacture, it will be appreciated that the present invention may be useful in any electrolytic process where an essentially level or planar copper deposit having high reflectivity is desired. Accordingly, suitable substrates include lead frames, interconnects, printed wiring boards, and the like.

All percent, ppm or comparable values refer to the weight with respect to the total weight of the respective composition except where otherwise indicated. All cited documents are incorporated herein by reference.

The following examples shall further illustrate the present invention without restricting the scope of this invention.

EXAMPLES

The amine number was determined according to DIN 53176 by titration of a solution of the polymer in acetic acid with perchloric acid.

The acid number was determined according to DIN 53402 by titration of a solution of the polymer in water with aqueous sodium hydroxide solution.

The molecular weight (Mw) was determined by size exclusion chromatography using hexafluoroisopropanol containing 0.05% potassium trifluoroacetat as eluent, hexafluoroisopropanol-packed (HFIP) gel columns as stationary phase and polymethylmethacrylate (PMMA) standards for determination of the molecular weights.

Example 1

Diethylenetriamine (1.00 kg, 9.69 mol) was introduced into a 4 l apparatus and stirred under a constant nitrogen stream. Water (250 g) was added resulting in a temperature increase up to 54 degree C. The solution was heated to 60 ° C. and adipic acid was added in portions during 30 min. During this time the temperature increased up to 112 degree C. Then the reaction mixture was stirred for 1 h at 120 degree C., the color turning into orange. Subsequently, the temperature was increased to 180 degree C. and water and traces of diethylenetriamine were destilled off for 3 h. Then the nitrogen stream was intensified to remove residual traces of water. The resulting distillate (594 g) showed an amine number of 0.485 mmol/g, indicating a 9.9 g diethylenetriamine content in the distillate. The heating was turned off and when the temperature reached 160 degree C., water (755 g) was added slowly resulting in a temperature drop to 106 degree C. After cooling to room temperature, again water (419 g) was added, resulting in a yellow-green solution of polyaminoamide (3165 g). The aqueous solution of the polyaminoamide showed a water content of 33.3% according to Karl-Fischer-titration, an amine number of 3.58 mmol/g and an acid number of 0.13 mmol/g. Gel permeation chromatography revealed an average molecular weight of Mw =28000 g/mol and a polydispersity of Mw/Mn=2.3.

Example 2

The aqueous solution of polyaminoamide from example 1 (1.00 kg; water content according to Karl-Fischer-titration: 33.3%) was placed into a 2 l autoclave and heated at 110 degree C. under nitrogen at 2 bar. Ethylene oxide (158 g, 3.58 mol) was added in portions at 110 degree C. over a period of 2 h. To complete the reaction, the mixture was allowed to post-react overnight. The reaction mixture was stripped with nitrogen. Alkoxylated polyaminoamide was obtained as an aqueous solution showing a water content of 31.2% and an amine number of 3.2 mmol/g.

Example 3

The aqueous solution of polyaminoamide from example 1 (1.04 kg; water content according to Karl-Fischer-titration: 33.3%) was placed into a 2 l autoclave and heated at 110 degree C. under nitrogen at 2 bar. Propylene oxide (216 g, 3.72 mol) was added in portions at 110 degree C. over a period of 3 h. To complete the reaction, the mixture was allowed to post-react overnight. The reaction mixture was stripped with nitrogen.

Alkoxylated polyaminoamide was obtained as an aqueous solution showing a water content of 41.6% and an amine number of 3.2 mmol/g.

Example 4

N,N'-bis(3-aminopropyl)-1,2-diaminoethane (116 g, 0.666 mol) was introduced into a 1 l apparatus and heated to 60 degree C. under a constant nitrogen stream. A solution of adipic acid (100 g, 0.684 mol) and N,N'-bis(3-aminopropyl)-1,2-diaminoethane (10.0 g, 0.0573 mol) in water (300 ml) was added dropwise. Then the reaction mixture was stirred for 2 h at 120 degree C. Subsequently, the temperature was increased to 180 degree C. and water (315 g) was destilled off for 3 h. The heating was turned off and when the temperature reached 160 degree C., water (150 g) was added slowly. The aqueous solution of polyaminoamide showed a water content of 43.7% according to Karl-Fischer-titration, an amine number of 4.44 mmol/g and an acid number of 0.3 mmol/g. Gel permeation chromatography revealed an average molecular weight of Mw=3650 g/mol and a polydispersity of Mw/Mn=1.9.

Example 5

The aqueous solution of polyaminoamide from example 4 (20.0 g; water content according to Karl-Fischer-titration: 43.7%) and additional water (78.7 g) were placed into a 250 ml apparatus and dimethyl sulphate (10.6 g, 84.4 mmol) was added slowly by a syringe pump. When the temperature increased to 34 degree C. the reaction mixture was cooled to room temperature again by an ice bath. The reaction mixture showed an amine number of 0.11 mmol/g, indicating incomplete quaternization of the amine atoms. Thus, an additional portion of dimethyl sulphate (1.62 g, 12.8 mmol) was added slowly. The resulting brown solution showed an amine number of 0 mmol/g, indicating complete quaternization of all amine atoms present in the polyaminoamide starting material. The aqueous solution of quaternized polyaminoamide showed a water content of 78.6%.

Figure 3A:
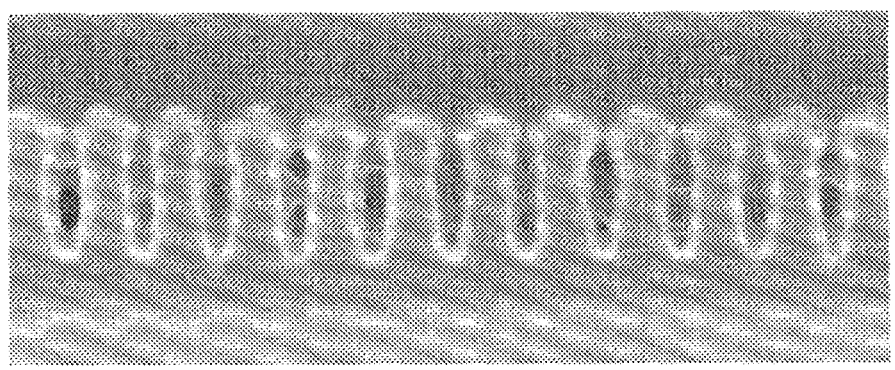
Figure 3B:
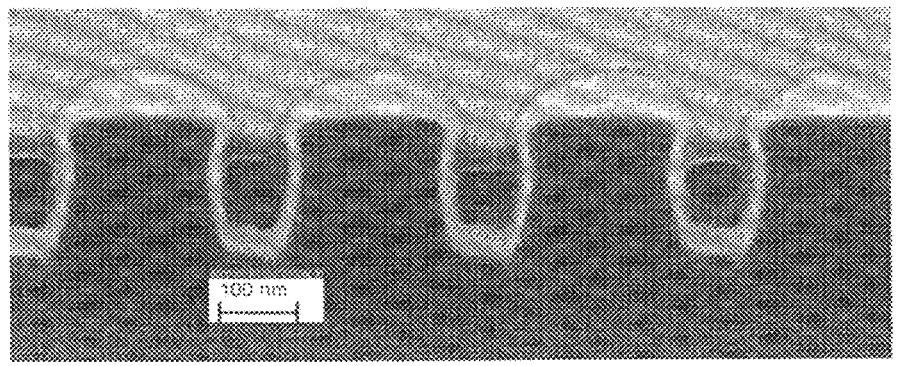

FIGS. 3a and 3b show the feature sizes of the copper seeded wafer substrates that were used for electroplating with the different plating baths described in the following sections. After copper seed deposition the smaller trenches shown in FIG. 3a had a width of 15.6 to 17.9 nanometer at the trench opening, a width of 34.6 to 36.8 nanometer at half height of the trench, and were 176.4 nanometer deep. The trenches shown in FIG. 3b had a width of about 100 nm.

Comparative Example 6

A plating bath was prepared by combining DI water, 40 g/l copper as copper sulfate, 10 g/l sulfuric acid, 0.050 g/l chloride ion as HCl, 0.028 g/l of SPS and 2.00 ml/l of a 5.3 wt % solution in DI water of a EO/PO copolymer suppressor having a molecular weight Mw of below 13000 g/mole and terminal hydroxyl groups.

A copper layer was electroplated onto a wafer substrate with feature sizes shown in FIGS. 3a and 3b, respectively, provided with a copper seed layer by contacting the wafer substrate with the above described plating bath at 25 degrees C. applying a direct current of −5 mA/cm$^2$ for 6 s and −5 mA/cm$^2$ for 27 s followed by −10 mA/cm$^2$ for 27 s respectively. The thus electroplated copper layer was cross-sectioned and investigated by SEM inspection.

Figure 4A:
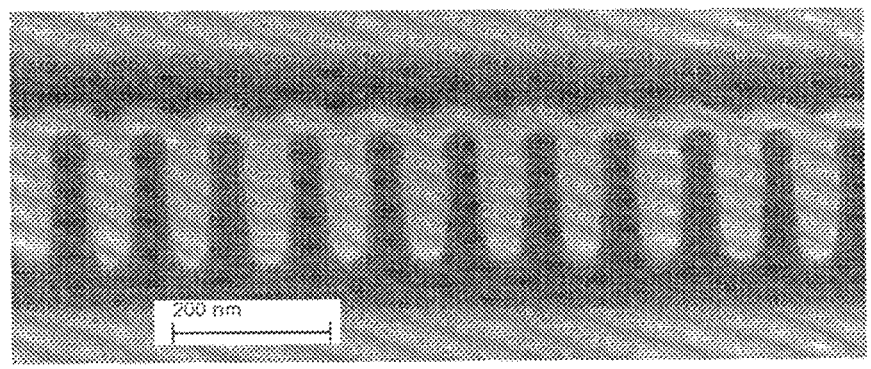
Figure 4B:
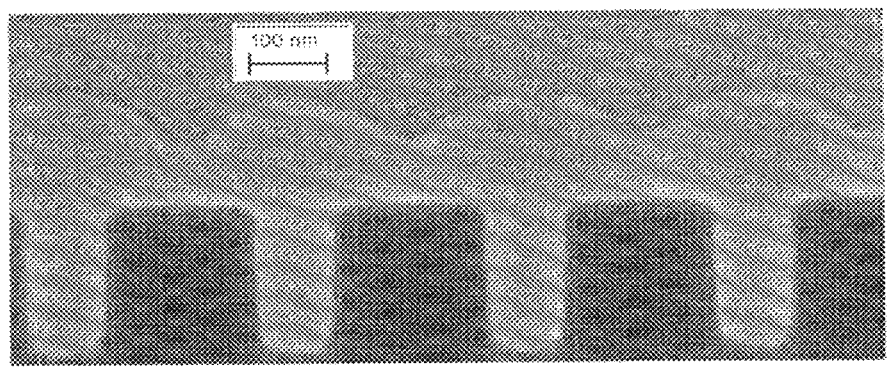

The result is shown in FIGS. 4a and 4b, respectively, providing the SEM images of fully filled trenches without exhibiting any defects like voids or seams. FIG. 4b clearly depicts the enhanced copper deposition above the fully filled trenches resulting in bump formation in contrast to the decreased copper deposition above the dielectric.

Example 7

The procedure of example 6 was repeated except that 0.625 ml/l of a 1% by weight aqueous solution of polyaminoamide from example 4 was added to the plating bath.

A copper layer was electroplated onto a wafer substrate as described in example 6. The thus electroplated copper layer was cross-sectioned and investigated by SEM inspection.

Figure 5A:
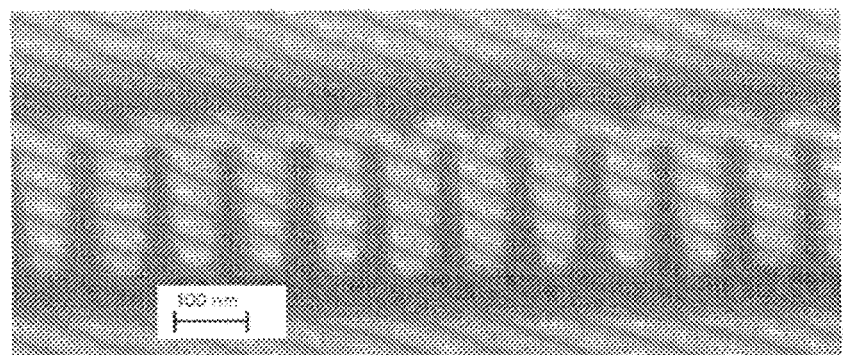
Figure 5B:
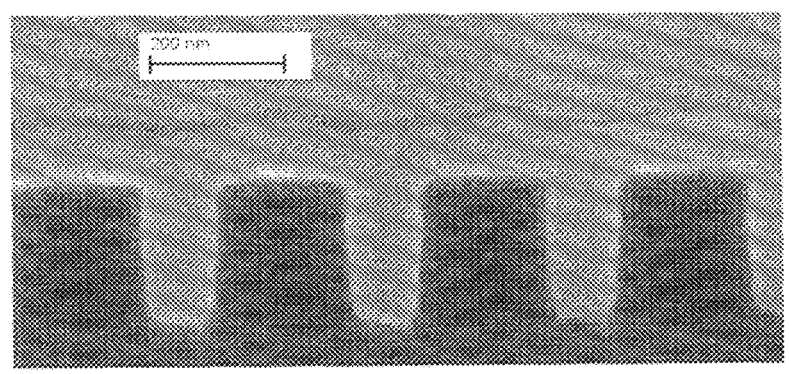

The result using a plating bath with the leveling agent as prepared in example 4 according to the present invention is shown in FIGS. 5a and 5b, respectively. The 16 to 100 nanometer wide trenches are completely filled without exhibiting any defects like voids or seams thus showing that there is not any interference in the gap filling by the leveling agent. FIG. 5b shows a balanced Cu deposition above the trenches and the dielectric.

Example 8

The procedure of example 6 was repeated except that 0.625 ml/l of a 1% by weight aqueous solution of the quaternized polyaminoamide from example 5 was added to the plating bath.

A copper layer was electroplated onto a wafer substrate as described in example 6. The thus electroplated copper layer was cross-sectioned and investigated by SEM inspection.

Figure 6:
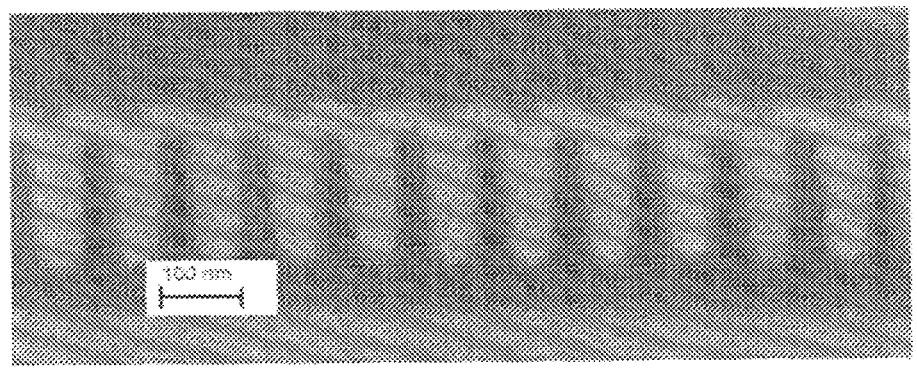

The result using a plating bath with the leveling agent as prepared in example 5 according to the present invention is shown in FIG. 6. The 16 to 37 nanometer wide trenches are completely filled without exhibiting any defects like voids or seams thus showing that there is not any interference in the gap filling by the leveling agent.

Comparative example 9

A copper plating bath was prepared by combining 40 g/l copper as copper sulfate, 10 g/l sulfuric acid, 0.050 g/l chloride ion as HCl, 0.100 g/l of an EO/PO copolymer suppressor, and 0.028 g/l of SPS and DI water. The EO/PO copolymer suppressor had a molecular weight of <5000 g/mole and terminal hydroxyl groups.

A copper layer was electroplated onto a structured silicon wafer purchased from SKW Associate Inc. containing trenches. These trenches varied in width ranging from 130 nm to several microns with a depth of approximately 250 nm and a separation ranging from 130 nm to several micrometers. Such wafer substrates were brought into contact with the above described plating bath at 25 degrees C. and a direct current of −5 mA/cm2 for 120 s followed by −10 mA/cm2 for 60 s was applied.

The thus electroplated copper layer was investigated by profilometry inspection with a Dektak 3, Veeco Instruments Inc. In the case of 130 nm and 250 nm feature sizes a field of nested wires was scanned and the height difference between the unstructured and structured area was measured. In the case of the 2 micrometer trenches the profilometer P16+, KLA Tencor GmbH was used and the height difference between the trench and the ridge was measured. The mean values of the height differences were calculated of at least from 10 height differences.

Figure 7A:
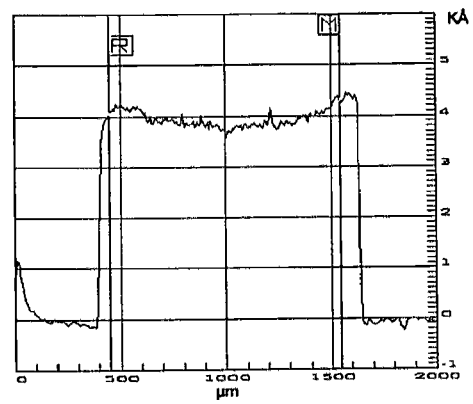
Figure 7B:
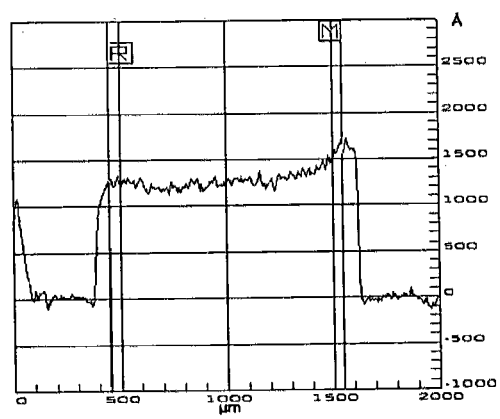
Figure 7C:
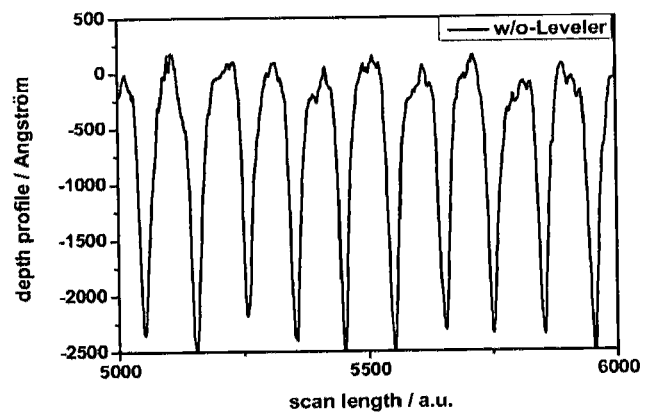

The results without using a leveling agent are shown in FIGS. 7a and 7b and show a profilometry cross-sectional scan of nested trenches having 0.130 micrometer width with a separation of 0.130 micrometer (FIG. 7a), respectively a cross-sectional scan of 0.250 micrometer features (FIG. 7b). Both, FIGS. 7a and 7b show a higher copper deposition rate on the structured area in contrast to the unstructured area. This phenomenon is well known as mounding and is strongly pronounced over the 0.130 and 0.250 micrometer trenches. FIG. 7c shows a profilometry scan of trenches having a width of 2.0 micrometer which show a significant groove depth, which is comparable to the non-plated substrate. The measured values for the 0.130 micrometer, 0.250 micrometer and 2.0 micrometer features are depicted in table 1.

Example 10

The procedure of example 9 was repeated except that 1 ml/l of a stock solution containing 1% (w/w) of the active leveling agent of example 1 was added to the plating bath.

A copper layer was electroplated onto a wafer substrate as described in example 9. The thus electroplated copper layer was investigated by profilometry as described in example 9.

Figure 8A:
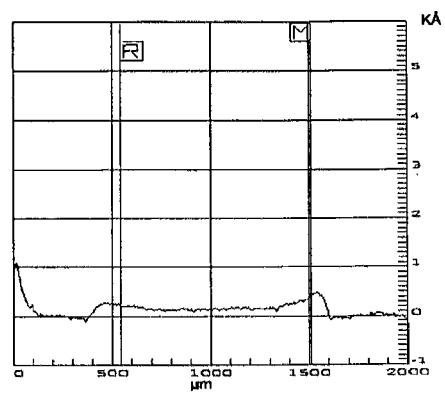
Figure 8B:
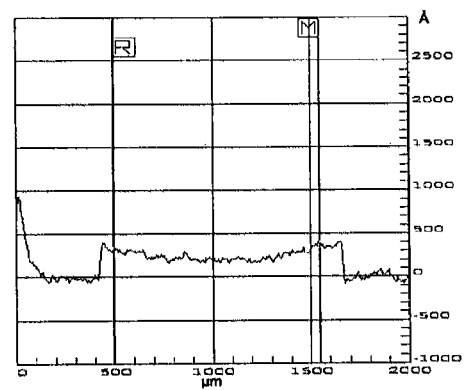
Figure 8C:
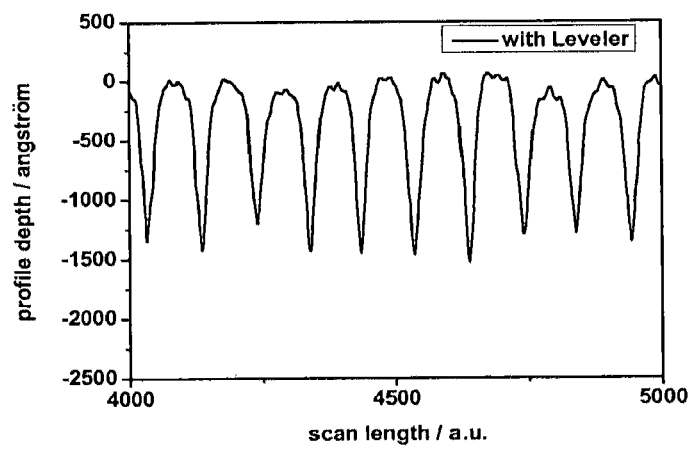

The results using a plating bath with a leveling agent according to the present invention are shown in FIGS. 8a,b,c for different trench sizes. The profilometry cross-sectional scan of nested trenches having 0.130 micrometer width with a separation of 0.130 μm (FIG. 8a), respectively a cross-sectional scan of 0.250 micrometer features (FIG. 8b) show a significant reduction of the mounding compared to prior art. FIG. 8c shows a profilometry scan of trenches having a width of 2.0 micrometer and show a noteworthy reduction of the groove depth compared to prior art. The measured values are depicted in table 1.

Example 11

The procedure of example 9 was repeated except that 1 ml/l of a stock solution containing 1% (w/w) of the active leveling agent of example 5 was added to the plating bath.

A copper layer was electroplated onto a wafer substrate as described in example 9. The thus electroplated copper layer was investigated by profilometry as described in example 9.

The values obtained from profilometry, as depicted in table 1, show a significant reduction of the mounding as well as a reduction of the groove depth compared to example 9 without a leveling agent.

Example 12

The procedure of example 9 was repeated except that 1 ml/l of a stock solution containing 1% (w/w) of the active leveling agent of example 4 was added to the plating bath.

A copper layer was electroplated onto a wafer substrate as described in example 9. The thus electroplated copper layer was investigated by profilometry as described in example 9.

The values obtained from profilometry, as depicted in table 1, show a significant reduction of the mounding as well as a reduction of the groove depth compared to example 9 without a leveling agent.

Example 13

The procedure of example 9 was repeated except that 1 ml/l of a stock solution containing 1% (w/w) of the active leveling agent of example 3 was added to the plating bath.

A copper layer was electroplated onto a wafer substrate'as described in example 9. The thus electroplated copper layer was investigated by profilometry as described in example 9.

The values obtained from profilometry, as depicted in table xxx, show a significant reduction of the mounding as well as a reduction of the groove depth compared to example 9 without a leveling agent.

Example 14

The procedure of example 9 was repeated except that 1 ml/l of a stock solution containing 1% (w/w) of the active leveling agent of example 2 was added to the plating bath.

A copper layer was electroplated onto a wafer substrate as described in example 9. The thus electroplated copper layer was investigated by profilometry as described in example 9.

The values obtained from profilometry, as depicted in table 1, show a significant reduction of the mounding as well as a reduction of the groove depth compared to example 9 without a leveling agent.

TABLE 1

| | mounding | | |
| --- | --- | --- | --- |
| Leveler | 0.130 micrometer | 0.250 micrometer | 2.0 micrometer |
| comparative example 9 | 370 nm | 123 nm | −250 nm |
| example 10 | −12 nm | −62 nm | −195 nm |
| example 11 | 55 nm | 7 nm | −180 nm |
| example 12 | 21 nm | 24 nm | −135 nm |
| example 13 | 62 nm | 31 nm | −155 nm |
| example 14 | 74 nm | 31 nm | −160 nm |

The invention claimed is:

1. A composition, comprising:
   a source of copper ions; and
   an additive comprising a polyaminoamide of formula (I):

$$E^1 \underset{O}{\overset{H}{\underset{\|}{N}}} D^1 \underset{O}{\overset{}{\underset{\|}{C}}} \left[ \underset{}{\overset{H}{\underset{}{N}}} \left( D^2 \underset{}{\overset{R^1}{\underset{}{N}}} \right)_n D^3 \underset{}{\overset{H}{\underset{}{N}}} D^1 \underset{O}{\overset{}{\underset{\|}{C}}} E^2 \right]_p \quad (I)$$

or a derivative of a polyaminoamide of formula (I) obtained by complete or partial protonation,
wherein:
   $D^1$ is, for each repeating unit 1 to p, independently a chemical bond or a divalent $C_1$-$C_{20}$-alkanediyl group which is optionally interrupted by at least one selected from the group consisting of a double bond and an imino group and/or is optionally, completely or partially, a constituent of a saturated or unsaturated carbocyclic 5- to 8-membered ring;
   $D^2$ and $D^3$ are each independently a straight chain or branched C1 to C6 alkanediyl;
   $R^1$ is, for each repeating unit 1 to n, independently $R^2$, a $C_1$-$C_{20}$-alkyl, or a $C_1$-$C_{20}$-alkenyl, and optionally substituted with a hydroxyl or an alkoxycarbonyl;
   $R^2$ is hydrogen;
   $E^1$ and $E^2$ are each independently selected from the group consisting of (a) a nucleophilically displaceable leaving group X, (b) NH—$C_1$-$C_{20}$-alkyl or NH—$C_1$-$C_{20}$-alkenyl, (c) H—{NH-[$D^2$-$NR^1$]$_n$-$D^3$-NH} or $R^2$—{$NR^2$-[$D^2$-$NR^1$]$_n$-$D^3$-NH}, (d) $C_1$-$C_{20}$-alkyl-CO—{NH-[$D^2$-$NR^2$]$_n$-$D^3$-NH}, and (e) $C_1$-$C_{20}$-alkenyl-CO—{NH-[$D^2$-$NR^2$]$_n$-$D^3$-NH};
   n is an integer from 1 to 250;
   p is an integer from 2 to 150; and
   q is from 0.01 to 5.

2. The composition of claim 1, wherein:
   $R^1$ is $R^2$; and
   $R^{14}$ is hydrogen or methyl.

3. The composition of claim 1, wherein:
   $D^1$ is a chemical bond or a $C_1$-$C_{20}$-alkanediyl group;
   $D^2$ and $D^3$ are each independently $(CH_2)_m$;
   $R^1$ is $R^2$ or methyl;
   $E^1$ and $E^2$ are each independently OH, an alkoxy, a halogen, H—{NH-[$D^2$-$NR^1$]$_n$-$D^3$-NH}, or $R^2$—{$NR^2$-[$D^2$-$NR^1$]$_n$-$D^3$-NH};
   m is 2 or 3;
   n is 1 or 2;
   p is an integer from 5 to 70; and
   q is a number from 0.1 to 2.

4. The composition of claim 1, wherein the polyaminoamide is obtained by reacting a polyalkylenepolyamine with a dicarboxylic acid.

5. The composition of claim 4, wherein the polyalkylenepolyamine is selected from the group consisting of diethylenetriamine, triethylenetetramine, tetraethylenpentamine, pentaethylenehexamine, diaminopropylethylenediamine, ethylenepropylenetriamine, 3-(2-aminoethyl)-aminopropylamine, dipropylenetriamine, a polyethyleneimine, and mixtures thereof.

6. The composition of claim 4, wherein the dicarboxylic acid is selected from the group of oxalic acid, malonic acid, succinic acid, tartaric acid, maleic acid, itaconic acid, glutaric acid, adipic acid, suberic acid, sebacic acid, phthalic acid and terephthalic acid, iminodiacetic acid, aspartic acid, glutamic acid, and mixtures thereof.

7. The composition of claim 1, further comprising:
   an accelerating agent.

8. The composition of claim 1, further comprising:
   a suppressing agent.

9. The composition of claim 1, in the form of an electroplating bath.

10. A process for depositing a metal layer on a substrate, the process comprising:
    a) contacting a metal plating bath comprising a composition of claim 1 with a substrate; and
    b) applying a current density to the substrate for a time sufficient to deposit a copper layer onto the substrate.

11. The process of claim 10, wherein the substrate comprises micrometer or submicrometer sized features and the deposition is performed to fill the micrometer or submicrometer sized features.

12. The process of claim 11, wherein the micrometer or submicrometer-sized features have at least one selected from the group consisting of a size from 1 to 1000 nm and an aspect ratio of 4 or more.

13. The composition of claim 1, wherein $R^1$ is, for each repeating unit 1 to n, independently $R^2$, a $C_1$-$C_{20}$-alkyl, or a $C_1$-$C_{20}$-alkenyl.

14. The composition of claim 1, wherein $E^1$ and $E^2$ are each independently selected from the group consisting of (b) NH—$C_1$-$C_{20}$-alkyl or NH—$C_1$-$C_{20}$-alkenyl, (c) H—{NH-[$D^2$-$NR^1$]$_n$-$D^3$-NH} or $R^2$—{$NR^2$-[$D^2$-$NR^1$]$_n$-$D^3$-NH}, (d) $C_1$-$C_{20}$-alkyl-CO—{NH-[$D^2$-$NR^2$]$_n$-$D^3$-NH}, and (e) $C_1$-$C_{20}$-alkenyl-CO—{NH-[$D^2$-$NR^2$]$_n$-$D^3$-NH}.

15. The process of claim 10, wherein the polyaminoamide of formula (I) functions as a leveling agent.

16. The process of claim 10, wherein overplating is reduced or substantially eliminated.

17. The process of claim 10, wherein the ratio a/b as defined in FIG. 2a is 1.5 or less.

18. The process of claim 10, wherein the ratio a/b as defined in FIG. 2a is 1.2 or less.

19. The process of claim 10, wherein the ratio a/b as defined in FIG. 2a is 1.1 or less.

20. The composition claim 1, which comprises a copper salt.

21. The composition of claim 1, which comprises at least one of copper sulfate, copper chloride, copper acetate, copper citrate, copper nitrate, copper fluoroborate, copper methane sulfonate, copper phenyl sulfonate and copper p-toluene sulfonate.

* * * * *